Dec. 23, 1969 J. L. WALLACE, JR 3,486,160

PROGRAMMABLE PRINTED CIRCUIT BOARD

Filed May 29, 1968

INVENTOR

J. L. WALLACE, JR.

BY Tipton D. Jennings

ATTORNEY

United States Patent Office 3,486,160
Patented Dec. 23, 1969

3,486,160
PROGRAMMABLE PRINTED CIRCUIT BOARD
Jacob L. Wallace, Jr., Springfield, Va., assignor to The Susquehanna Corporation, Fairfax County, Va., a corporation of Delaware
Filed May 29, 1968, Ser. No. 733,049
Int. Cl. H05k *1/02*
U.S. Cl. 339—17 6 Claims

ABSTRACT OF THE DISCLOSURE

An example of the programmable printed circuit board is one having a number of pairs of printed circuit paths arranged in columns. Posts are electrically connected into these columns to form pairs of posts at a number of locations on the board. At each of these locations is a third post. These third posts connect through the board to individual paths on the botom face of the board.

One path in each pair is the Mark path and one path is the Space path. To program the board, a conductive clip is connected at each position between the center post and either of the posts connected to the Mark and Space paths, as desired, to give a preselected Mark-Space sequence.

BACKGROUND OF THE INVENTION

The present invention relates to a programmable printed circuit board, and, in particular, to a printed circuit board containing mechanical means to assist in selecting, generating or detecting a predetermined code sequence.

In prior-art code sequence detection, where it is necessary to have one or more predetermined characters recognized as a security measure before a receiver or control point will function or respond to subsequently transmitted signals, it has been the practice to strap or patch extensively so that the pulses forming the character are properly routed to some form of recognition means. With the common use of printed circuit techniques and the desire for compact electronic equipment, the use of patching in this environment is not only difficult but undesirable from a space-saving standpoint.

SUMMARY

The problems of the prior art are overcome in the present invention by the utilization of mechanical means on the printed circuit board itself, which act as switches to enable the preselection of the desired code sequence.

Briefly, the present invention is directed to a printed circuit board having top and bottom surfaces with a plurality of pairs of conductive paths formed on the top surface. At least one conductive post is electrically connected to each path. These posts are mounted to the board and extend outwardly from the top surface such that there is a pair of posts associated with each path pair. A third conductive post is associated with each post pair, these third posts also being mounted on the board to extend outwardly from the top surface. A second plurality of conductive paths is formed on a surface of the board and each third post is electrically connected to one of these conductive paths. Mating means are also provided which have a pair of sockets for selectively connecting one post in a pair of posts to its associated center post.

It is an object of the present invention to provide an improved progrmmable printed circuit board.

It is a further object of the present invention to provide such a board having mechanical conecting means which permits programming or reprogramming to be readily accomplished without difficulty.

A still further object is to provide an improved printed circuit board having mechanical switching means formed as part of the board to permit preselection of desired signal paths.

Another object of the invention is to provide an improved progrmmable printed circuit board having high reliability yet being small in size.

Other objects and advantages will become apparent from a reading of the attached description in conjunction with the attached drawings.

BRIEF DESCRIPTION OF THE DRAWINGS

With reference to FIGURES 1 and 2 there is shown, respectively, the top and bottom views of a printed circuit board 10 which is made of a rigid dielectric material and has a plurality of conductive paths 12 and 13 formed, respectively, on the top surface 14 and on the bottom surface 16 of this board. The blank portions of board 10 can be filled with electronic components, space permitting, and the conductive paths normally required for biasing, input and output, and the connections between the various components, as examples.

At the upper part of top surface 14 there is shown five electronic components **18*a*–18*e* arranged in a row. As an aid in discussing this invention, these components 18 shall be considered as five stages of a shift register. Electrically connected to and extending downwardly in columns from each stage 18 is a pair of printed circuit lines identified by the numbers 20–28. Each of these columns is electrically connected to posts 30 mounted in the printed circuit board. As shown in FIGURE 2, these posts 30 extend through the board 10 and terminate at the bottom surface 16. However, they are not shown as connected to any conductive path 13** on the bottom surface.

Figure 1:
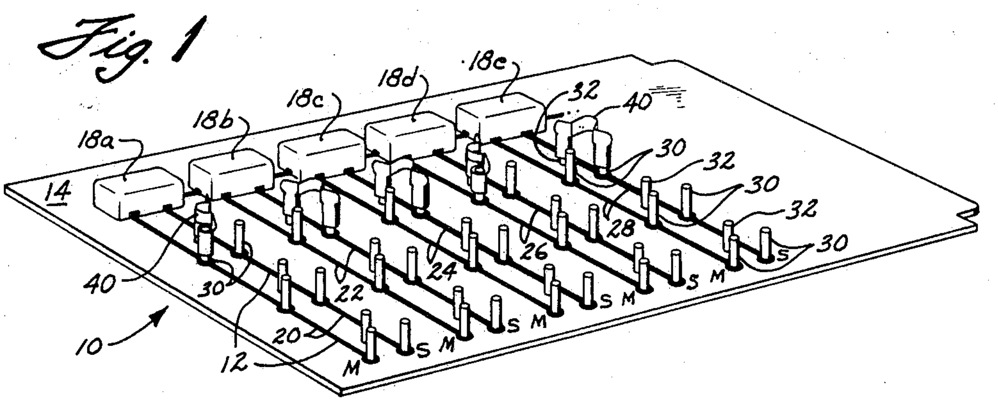
FIGURE 1 is a three-dimensional view of the top surface of a printed circuit board according to this invention.

As can be seen by FIGURE 1, the arrangement of the posts 30 is such as to form three horizontal rows of posts with a pair of posts associated with each path pair 20–28. Centered between each pair of posts 30 is a third post 32. None of these posts 32 is electrically connected to any of the conductive paths 20–28 on the top surface 14. Each post 32 also extends through the thickness of the board 10 and is connected to a separate conductive path 13 on the bottom surface 16.

Each of the posts 30 and 32 is a conductive rod, preferably made of copper or brass. These rods extend a short distance above the top surface 14 of board 10, e.g. one-half inch. Holes are suitably formed in the board 10 to receive the posts 30 and 32 and are sized to make a close fit with these posts when they are inserted. Solder is applied to the posts at both the top and bottom surfaces so that good electrical contact is made with the printed circuit paths and also these posts become rigidly mounted in the boards 10.

Figure 3:
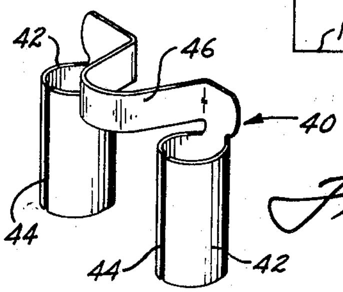
FIGURE 3 is a three-dimensional view of a clip used in the programming of the board of FIGURE 1.

The spacing between each center post 32 and its associated posts 30 is the same throughout the board. To connect a center post 32 with either of its associated posts 30, a clip 40, as shown in FIGURE 3, is used. The clip 40 is made of an electrically conductive metal such as copper or brass and has two spaced sockets 42. The spacing of these sockets is the same as that between a center post 32 and a post 30. The sockets are generally cylindrical in shape and undersized but have a slot 44 throughout their length so that they will yield when receiving posts and thereby insure a tight friction fit with such posts. The clip 40 has a U-shaped center member 46 connecting the two sockets 42. This U-shaped member 46 is less in height than the height of either socket so that it can be easily grasped by the fingers to facilitate the connecting and disconnecting of the clip with the posts 30 and 32.

With reference again to FIGURE 1, each of the conductive paths in each pair of conductors 20–28 is labeled with either "M" or an "S" which identify, respectively, the Mark line and the Space line of the pair. To program the board 10, a clip 40 is connected between each center post 32 and one of the posts 30. For example, with reference to the upper row of posts, a clip 40 has been mated to the center post 32 and the Mark post 30 associated with pair 20. With regard to the conductive pair 22, a clip 40 has been mated with the center conductor 32 and the Space post. With conductive pair 24, the clip has been mated to the Space post; with conductive pair 26, the clip has been mated to the Mark post; and with the conductive pair 28, the clip has been mated with the center post 32 and the Space post. Thus, by viewing this top row in terms of a telegraph or data character, it is programmed for the character formed by MARK, SPACE, SPACE, MARK, SPACE.

When a clip 40 is connected between a center post 32 and one of the two posts 30, any potential level or signal which is present on the conductive line 12 associated with the mated post is carried by clip 40 to the center post 32. On the bottom surface 16 of board 10 the line 13 which is associated with that center post presents or carries this signal condition to an output terminal or to other electronic circuitry. Thus, with reference to the programmed character of the top row, each center post 32, and accordingly its associated output line 13 shown on the bottom surface 16, is at the potential as the Mark or Space path to which its clip 40 is mated.

Figure 2:
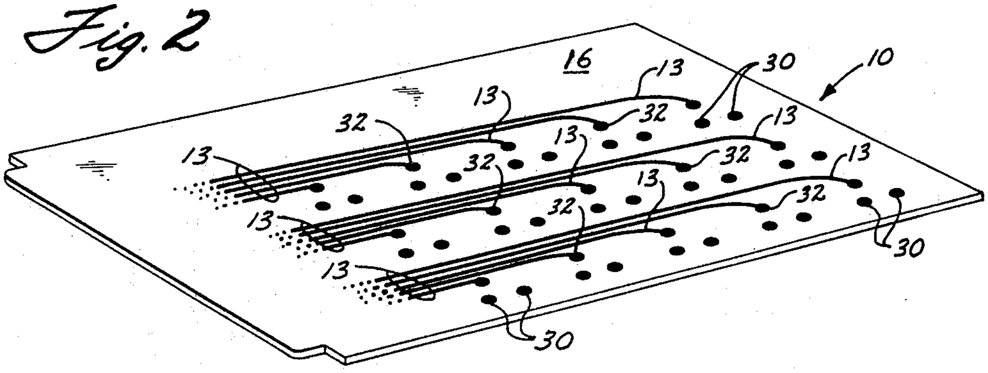
FIGURE 2 is a three-dimensional view of the bottom surface of the board of FIGURE 1.
Figure 4:
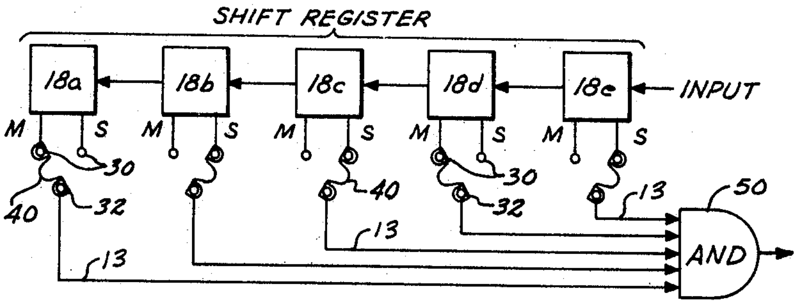
FIGURE 4 shows a circuit arrangement presented as an aid in understanding this invention.

As an aid in understanding the electrical operation of the apparatus described in FIGURES 1–3, there is presented in FIGURE 4 a circuit arrangement which utilizes the post/clip programming technique. Blocks **18*a*–18*e* again represent the five stages of a shift register. Each block 18 has an output line labeled MARK and an output line labeled SPACE, each of which terminates in a post 30. Connected between one of the posts 30 and a center post 32 is a clip 40**, and this programming has, for ease of description, been chosen to be the same as just described in connection with the top row of FIGURE 1, i.e., MARK, SPACE, SPACE, MARK, SPACE.

Each of the lines 13, which lead away from the center post 32, is the same as the lines 13 shown on the bottom face of board 10 (FIGURE 2). These lines terminate at the input to an AND gate 50. This AND gate 50 has not been previously described but if space permitted, it could be attached to the board 10 with its inputs being one group of conductive paths 13 shown on the bottom surface 16.

In operation, when a telegraph or data character, having the aforedescribed preselected or preprogrammed sequence, is inserted into shift register 18, each stage will provide an output on the appropriate line, MARK or SPACE, to which the post 32 is connected. For example, with stage **18*a* the output appears on the MARK line; stage 18*b*, the output is on the SPACE line, stage 18*c*, the SPACE line; stage 18*d*, the MARK line; stage 18*e*, the SPACE line, An output now appears simultaneously on each of the conductors 13 leading into AND gate 50**. Accordingly, this AND gate will open, and a signal will pass.

Because a preprogrammed code arrangement will respond to only a character having the same code sequence, any other character inserted into shift register 18 will not cause AND gate 50 to open. This is because there will be at least one output line 13 which is not at an enabling potential. For example, assume the character loaded into shift register 18 had a MARK at the third position instead of a SPACE. The enabling potential out of stage **18*c* would be on the M line. Because clip 40 couples post 32 to the post 30 associated with the S line, no enabling potential appears on the associated line 13 and AND gate 50** will not open.

With reference once again to FIGURES 1 and 2, it can be seen that two additional rows of posts 30 and associated center posts 32 has been depicted. Each row is also associated with a group of output paths 13 on bottom surface 16. These rows can be programmed by the use of clips 40 in the same manner as just described. If, in subsequent operation, a code sequence or character is loaded into the shift register 18 which corresponds to any of the preprogrammed characters, then the group of associated conductive paths 13 leading away from center post 32 on bottom surface 16 will contain enabling outputs which can be applied to other circuitry, such as an AND gate (not shown) as earlier described. If reprogramming of any row is desired, clips 40 in that row can be readily removed and reconnected to the desired posts.

It will be apparent that various modifications may be made herein within the scope of this invention and it is desired, therefore, that only such limitations be placed on the invention as are imposed by the prior art.

What is claimed is:

1. A programmable printed circuit board comprising top and bottom surfaces, a plurality of pairs of conductive paths formed on the top surface of said board, at least one conductive post electrically connected to each conductive path, each post being mounted to the board and extending outwardly from said top surface and forming a pair of adjacent posts, a third conductive post adjacent to each said pair of posts, each third post being mounted to the board and extending outwardly from said top surface, a second plurality of conductive paths formed on one surface of said board, each third post being electrically connected to one of said second plurality of conductive paths, and a plurality of conductive mating means each selectively connecting one post of said pair of posts to its adjacent third post.

2. A programmable printed circuit board as claimed in claim 1 wherein said second plurality of conductive paths is formed on the bottom surface of said board, and each third post is mounted through the thickness of the board and electrically connected to one of said second plurality of conductive paths on the bottom surface.

3. A programmable printed circuit board as claimed in claim 1 comprising a plurality of conductive posts electrically connected to each conductive path in said plurality of pairs of paths forming a plurality of pairs of posts connected to each pair of conductive paths, said plurality of pairs of posts being arranged in a plurality of rows on said board.

4. A programmable printed circuit board as claimed in claim 2 comprising a plurality of conductive posts electrically connected to each conductive path in said plurality of pairs of paths forming a plurality of pairs of posts connected to each pair of conductive paths, said plurality of pairs of posts being arranged in a plurality of rows on said board.

5. A programmable printed circuit board as claimed in claim 1 wherein said plurality of conductive mating means is a plurality of metal clips each having a pair of post-receiving sockets and a protrusion facilitating the connecting and disconnecting of its sockets with the selected posts.

6. A programmable printed circuit board as claimed in claim 4 wherein said plurality of conductive mating means is a plurality of metal clips each having a protrusion facilitating the connecting and disconnecting of its sockets with the selected posts.

References Cited

UNITED STATES PATENTS

| | | | |
|---|---|---|---|
| 3,179,913 | 4/1965 | Mittler et al. | |
| 3,267,407 | 8/1966 | Humphries et al. | 339—18 |

DARRELL L. CLAY, Primary Examiner

U.S. Cl. X.R.

29—625; 317—101; 339—18